(12) United States Patent
Wang

(10) Patent No.: US 8,679,925 B2
(45) Date of Patent: *Mar. 25, 2014

(54) METHODS OF MANUFACTURING SEMICONDUCTOR DEVICES AND TRANSISTORS

(71) Applicant: Taiwan Semiconductor Manufacturing Company, Ltd., Hsin-Chu (TW)

(72) Inventor: Yu-Ping Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/730,590

(22) Filed: Dec. 28, 2012

(65) Prior Publication Data

US 2013/0171790 A1    Jul. 4, 2013

Related U.S. Application Data

(63) Continuation of application No. 13/342,772, filed on Jan. 3, 2012, now Pat. No. 8,377,779.

(51) Int. Cl.
*H01L 21/336* (2006.01)
(52) U.S. Cl.
USPC .......... 438/283; 438/197; 438/269; 438/481; 257/E21.421; 257/E21.562
(58) Field of Classification Search
USPC ................. 438/283, 284, 197, 167, 269, 481; 257/E21.421, E21.562
See application file for complete search history.

(56) References Cited

U.S. PATENT DOCUMENTS

| 6,642,090 | B1 * | 11/2003 | Fried et al. ............... | 438/164 |
| 6,924,178 | B2 * | 8/2005 | Beintner ................ | 438/157 |
| 7,300,837 | B2 * | 11/2007 | Chen et al. ............ | 438/213 |
| 7,374,990 | B2 * | 5/2008 | Tang et al. ............ | 438/212 |
| 7,550,773 | B2 * | 6/2009 | Booth et al. ............ | 257/72 |
| 8,264,021 | B2 | 9/2012 | Lai et al. | |
| 8,377,779 | B1 * | 2/2013 | Wang ...................... | 438/283 |
| 2005/0124099 | A1 | 6/2005 | Beintner et al. | |
| 2005/0202608 | A1 | 9/2005 | Beintner | |
| 2012/0091538 | A1 * | 4/2012 | Lin et al. ................ | 257/401 |

FOREIGN PATENT DOCUMENTS

| JP | 2005268782 A | 9/2005 |
| KR | 101217327 B1 | 12/2012 |

* cited by examiner

*Primary Examiner* — Michael Trinh
(74) *Attorney, Agent, or Firm* — Slater & Matsil, L.L.P.

(57) ABSTRACT

Methods of manufacturing semiconductor devices and transistors are disclosed. In one embodiment, a method of manufacturing a semiconductor device includes providing a workpiece comprising a plurality of fins, and forming a semiconductive material over a top surface of the plurality of fins. An etch stop layer is formed over the semiconductive material, and an insulating material is disposed over the etch stop layer. The insulating material and a portion of the etch stop layer are removed from over the plurality of fins. Forming the semiconductive material or forming the etch stop layer are controlled so that removing the portion of the etch stop layer does not remove the etch stop layer between a widest portion of the semiconductive material over the plurality of fins.

20 Claims, 9 Drawing Sheets

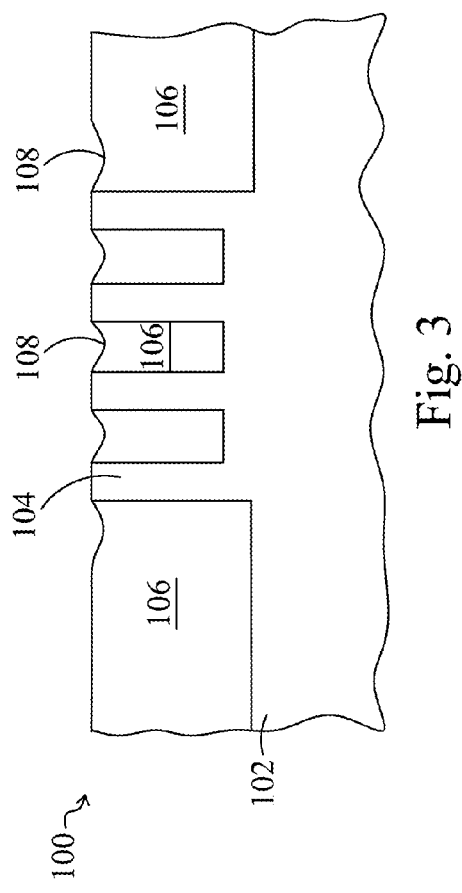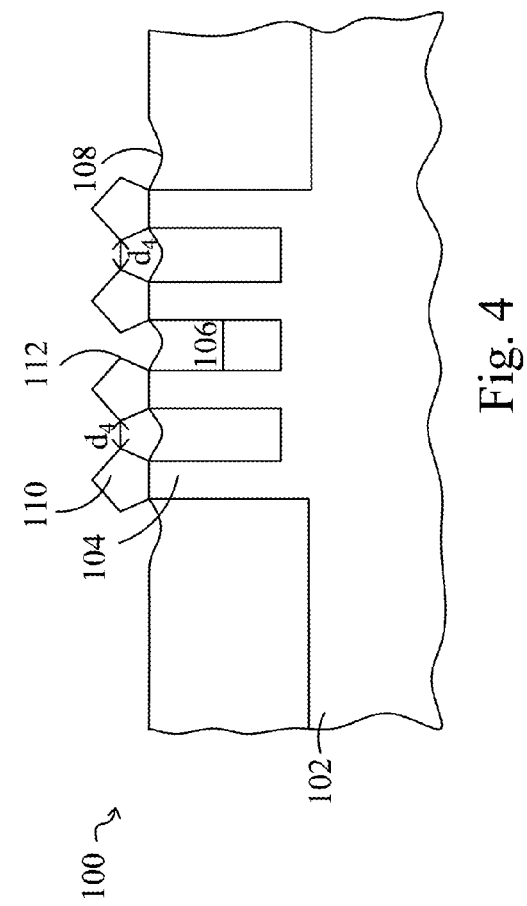

METHODS OF MANUFACTURING SEMICONDUCTOR DEVICES AND TRANSISTORS

This application is a continuation of U.S. patent application Ser. No. 13/342,772, U.S. Pat. No. 8,377,779 filed on Jan. 3, 2012, and entitled "Methods of Manufacturing Semiconductor Devices and Transistors," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Multiple gate field-effect transistors (MuGFETs) are a recent development in semiconductor technology which typically are metal oxide semiconductor FETs (MOSFETs) that incorporate more than one gate into a single device. The multiple gates may be controlled by a single gate electrode, where the multiple gate surfaces act electrically as a single gate, or by independent gate electrodes. One type of MuGFET is referred to as a FinFET, which is a transistor structure with a fin-like semiconductor channel that is raised vertically out of the silicon surface of an integrated circuit.

In some semiconductor designs, multiple FinFETs are used in a single transistor design, with fins of semiconductive material being placed in parallel. Sometimes, epitaxial growth of semiconductive material is formed on tops of the fins. The epitaxial growth may be merged or non-merged, depending on the design.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1 through 8 show cross-sectional views of a method of manufacturing a semiconductor device in accordance with an embodiment of the present disclosure;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to methods of manufacturing semiconductor devices and transistors. Novel methods of fabricating FinFET transistors will be described herein.

Figure 1:
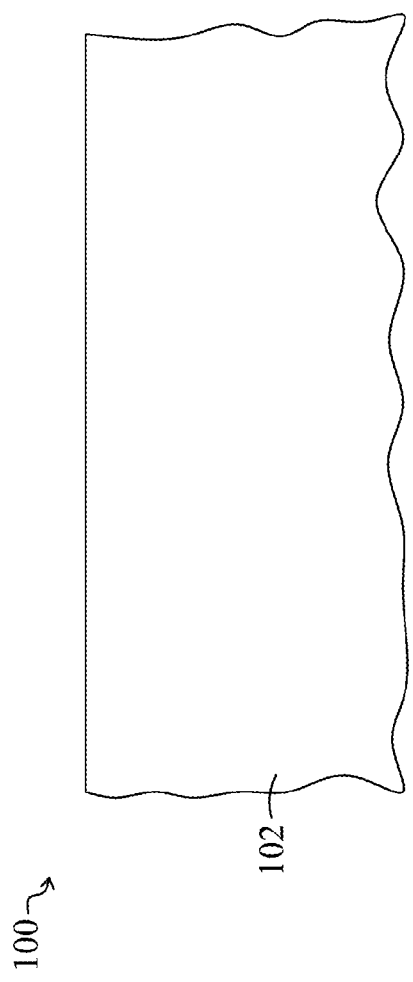

FIGS. 1 through 8 show cross-sectional views of a method of manufacturing a semiconductor device 100 in accordance with an embodiment of the present disclosure. Referring first to FIG. 1, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a bulk substrate or a semiconductor-on-insulator (SOI) substrate, as examples.

Figure 2:
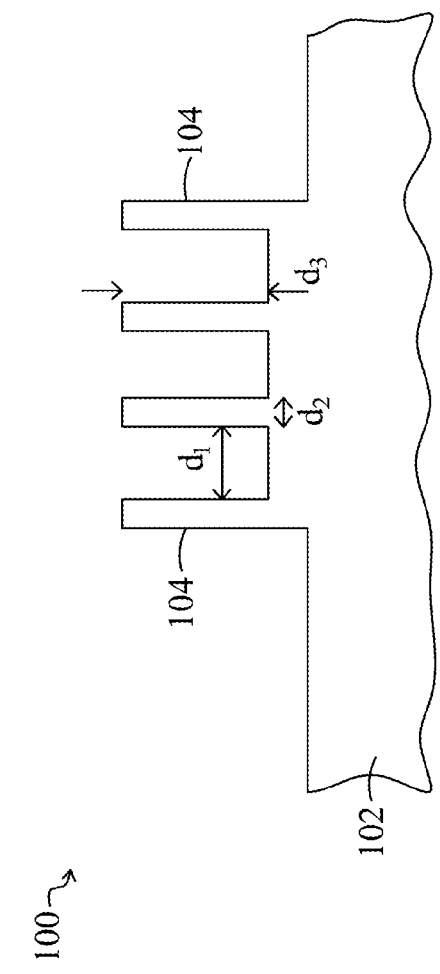

A plurality of fins 104 are formed over the workpiece 102, as shown in FIG. 2. The fins 104 may be manufactured using several methods, depending on the type of workpiece 102. In some embodiments, the workpiece 102 comprises a substrate comprising a bulk substrate, such as bulk Si, bulk SiP, bulk SiGe, bulk SiC, bulk Ge, or a combination thereof, for example. The fins 104 are formed in a top portion of the workpiece 102 comprising the bulk substrate. In other embodiments, the fins 104 may be formed from a workpiece 102 comprising an SOI substrate. The SOI substrate comprises two layers of semiconductor material such as silicon or germanium disposed on both sides of an insulating material. One layer of the semiconductor material is patterned to form the fins 104 in this embodiment. The workpiece 112 may comprise a SOI-Si workpiece, a SOI-SiGe workpiece, or combinations thereof with a bulk substrate, for example.

Four fins 104 are shown in the drawings; alternatively, two or more fins 104 may be included in a single semiconductor device 100. 7, 14, 20, or other numbers of fins 104 may be formed in a single transistor, for example. The fins 104 are formed parallel to one another extending in and out of the page in the views shown in FIGS. 2 through 8. The fins 104 comprise portions of transistors in accordance with some embodiments. Depending on the design, the fins 104 may comprise channels, source regions, or drain regions of a transistor, for example. The fins 104 may comprise fins of a FinFET in some embodiments.

The fins 104 may be formed using photolithography and an etch process, a direct etch process, or micromachining, as examples. The fins 104 may be spaced apart from each other by a distance comprising dimension $d_1$, which may comprise about 10 to 1,000 nm. The fins 104 may comprise a width comprising dimension $d_2$, which may comprise about 5 to 100 nm. The fins 104 may comprise a height comprising dimension $d_3$ which may comprise about 20 to 1,000 nm. The fins 104 may extend lengthwise in and out of the paper by several μm. Alternatively, dimensions $d_1$, $d_2$, $d_3$ and the length of the fins 104 may comprise other values.

An insulating material 106 which may comprise a field oxide, shallow trench isolation (STI) or other insulating material is disposed between the fins 104, as shown in FIG. 3. The insulating material 106 may comprise an oxide such as silicon dioxide or other types of dielectric materials. The insulating material 106 may comprise recessed regions 108 proximate the fins 104 due to the process used to form the insulating material 106. The insulating material 106 may be deposited over the top surfaces of the fins 104, and the excess insulating material 106 may be removed using a chemical-mechanical polishing (CMP) and/or etch process, for example.

A semiconductive material 110 is formed over the top surfaces of the fins 104, as shown in FIG. 4. The semiconductive material 110 is formed by epitaxial growth in some embodiments, for example. A precursor may be introduced (e.g., into a chamber the workpiece 102 is being processed in), and the top surface of the fins 104 may act as a seed crystal for the crystalline orientation of the semiconductive material 110 during the epitaxial growth process, for example. The semiconductive material 110 may comprise Si, SiGe, SiC, SiP, SiPC, or other semiconductor materials that are undoped or doped with other elements, as examples.

The semiconductive material 110 is wider proximate central regions than proximate top surfaces or bottom surfaces of the semiconductive material 110, as shown in FIG. 4. The semiconductive material 110 may be spaced apart from adjacent semiconductive material 110 at the wider central regions 112 over adjacent fins 104 by a distance comprising dimension $d_4$. The wider regions 112 may not be disposed exactly in the center between the top surface and the bottom surface of the epitaxially grown semiconductive material 110. The wider regions 112 may be positioned more toward the bottom surface of the semiconductive material 110 as shown in FIG. 4, or the wider regions 112 may be positioned more towards the top surface of the semiconductive material 110, depending on the crystal growth and crystalline structure of the semiconductive material 110. Dimension $d_4$ may comprise about 5 to 1,000 nm in some embodiments, although alternatively, dimensions $d_4$ may comprise other values. In accordance with embodiments of the present disclosure, dimension $d_4$ is greater than 0; e.g., the semiconductive material 110 over the top surfaces of the fins 104 is non-merged.

Figure 5:
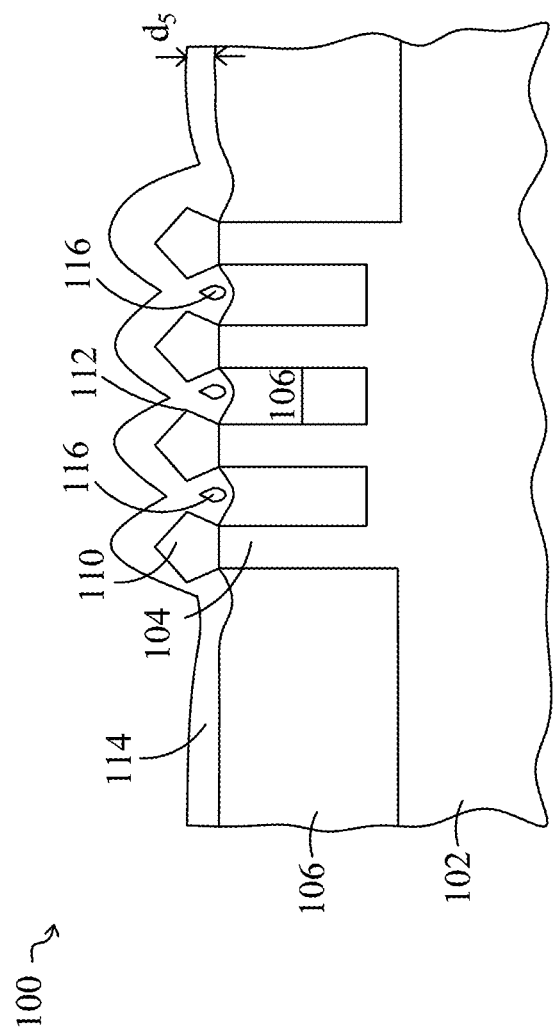

A contact etch stop layer (CESL) 114 is formed over the semiconductive material 110 and over the insulating material 106, as shown in FIG. 5. The CESL 114 is also referred to herein as an etch stop layer or a first etch stop layer. The CESL 114 may comprise SiN, SiON, SiC, or SiOC, as examples, although alternatively, the CESL 114 may comprise other materials. The CESL 114 may comprise a material having an etch selectivity to a subsequently deposited insulating material, such as layer 118 shown in FIG. 6. The CESL 114 may be deposited using chemical vapor deposition (CVD) or other types of deposition processes. In some embodiments, the CESL 114 is formed using flowable CVD, as an example. The thickness of the CESL 114 comprises a dimension $d_5$ which may comprise about 15 to 50 nm in some embodiments, although alternatively, the CESL 114 may comprise other dimensions.

A portion of the CESL 114 is formed between the semiconductive material 110 on top of the fins 104. The CESL 114 may be conformal and take the shape of the topography of the insulating material 106 and the epitaxially grown semiconductive material 110. The CESL 114 is formed beneath the widest portions 112 of the semiconductive material 110. In some embodiments, apertures 116 may form in the CESL 114. The optional apertures 116 may form at a vertical height in the structure that is beneath two adjacent wider portions 112 of the semiconductive material 110, as shown.

Figure 6:
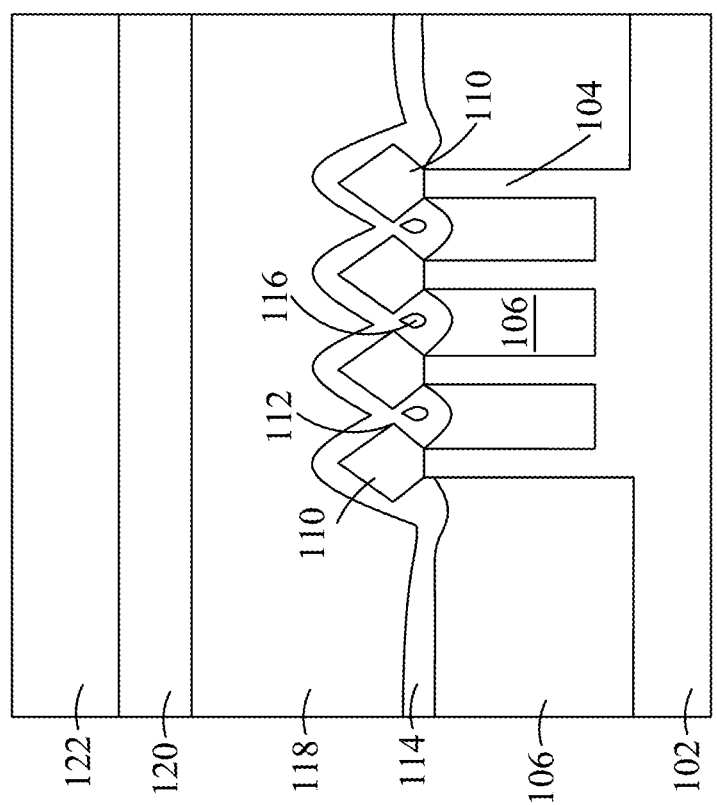

An insulating material 118/120/122 is formed over the CESL 114, as shown in FIG. 6. The insulating material 118/120/122 comprises three layers in the embodiment shown; alternatively, the insulating material 118/120/122 may comprise a single layer or two or more layers. The insulating material 118/120/122 in the embodiment shown comprises a first inter-level dielectric (ILD) 118 formed over the first etch stop layer 114, a second etch stop layer 120 formed over the first ILD 118, and a second ILD 122 formed over the second etch stop layer 120. The second etch stop layer 120 may comprise similar materials described for the first etch stop layer 114, for example. The second etch stop layer 120 may comprise a middle etch stop layer (MESL). The first ILD 118 and the second ILD 122 may comprise an oxide, a nitride, or other types of insulating materials, as examples.

Figure 7:
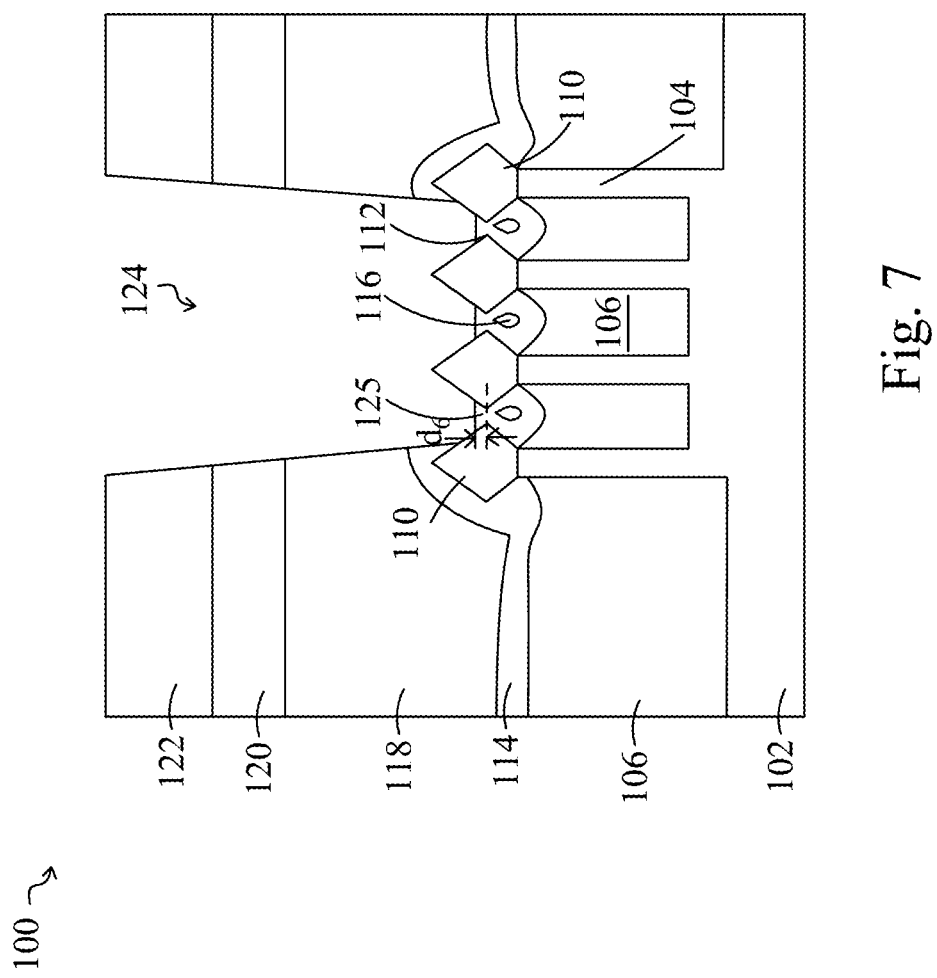
Figure 8:
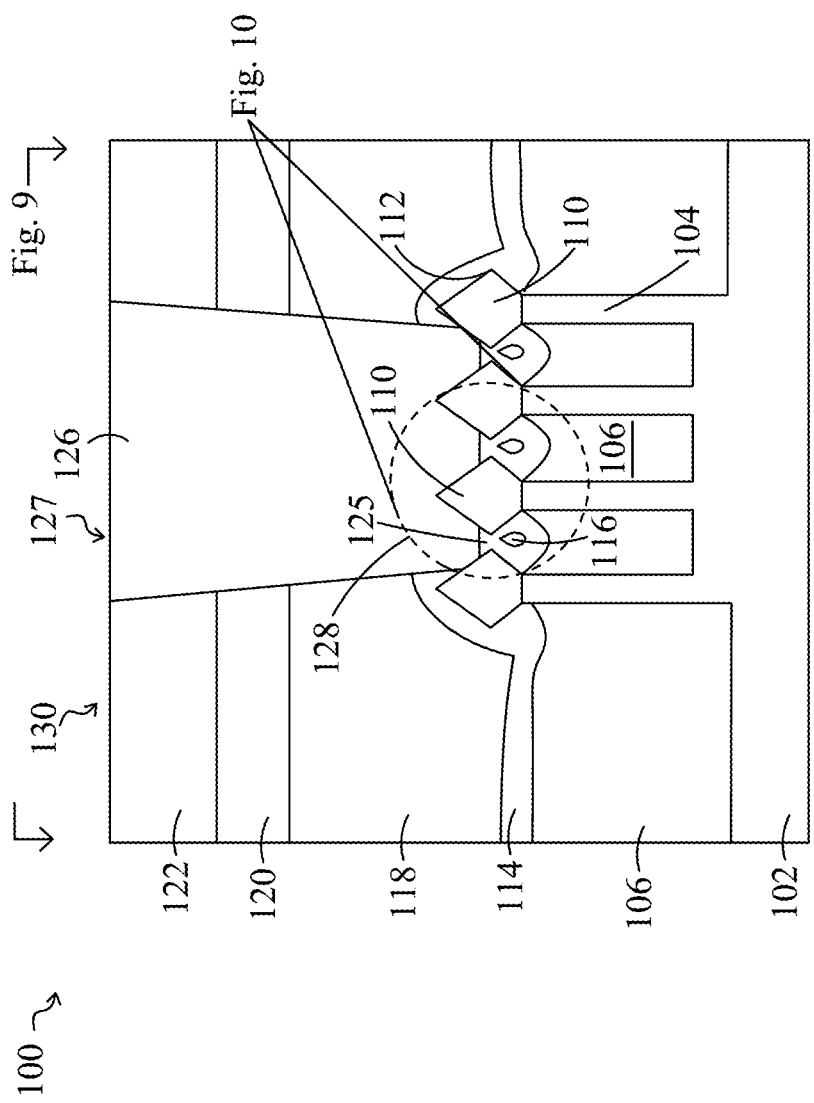

Next, a contact 127 is formed that is electrically coupled to the fins 104, e.g., electrically coupled to the semiconductive material 110 formed over the fins 104, as shown in FIGS. 7 and 8. The contact 127 is formed by removing the insulating material 118/120/122 and a portion of the etch stop layer 114 over the plurality of fins 104, e.g., a top portion of the etch stop layer 114 over the semiconductive material 110 is also removed, as shown in FIG. 7. The insulating material 118/120/122 and the top portion of the etch stop layer 114 are removed using an etch process, for example. The etch process may be adapted to detect when the etch stop layer 114 is reached, by detecting by-products of the etch process, and the etch process may be adapted to stop when by-products of the etch stop layer 114 are reduced or slowed down, e.g., indicating that the etch stop layer 114 has been removed from the top surfaces of the semiconductive material 110. If apertures 116 are formed in the etch stop layer 114 between the semiconductive material 110, the etch process does not reach the apertures 116 in the etch stop layer 114, in accordance with embodiments. Removing the insulating material 118/120/122 and the top portion of the etch stop layer 114 over the plurality of fins 104 creates a recess 124 in the insulating material 118/120/122 and the top portion of the etch stop layer 114. Removing the top portion of the etch stop layer 114 over the fins 104 leaves a top portion of the semiconductive material 110 over the top surface of the fins 104 exposed, as shown in FIG. 7.

In accordance with embodiments, a portion 125 of the etch stop layer 114 is left remaining above or over the widest portion 112 of the semiconductive material 110 over the fins 104. The portion 125 of the etch stop layer 114 left remaining may comprise a dimension $d_6$ that may comprise at least 15 nm in some embodiments. Alternatively, dimension $d_6$ may comprise other values.

A conductive material 126 is formed over the fins 104, e.g., over the exposed top portions of the semiconductive material 110 over the fins 104, as shown in FIG. 8. The conductive material 126 may comprise copper, tungsten, other conductive materials, or multiple layers or combinations thereof, as examples. Alternatively, the conductive material 126 may comprise other materials. As initially deposited, the conductive material 126 also may be formed over the top surface of the second ILD 122, not shown, and a CMP and/or etch process may be used to remove the excess conductive material 126 from over the second ILD 122, leaving a contact 127 formed of the conductive material 126. The contact 127 may comprise a slot contact in some embodiments that extends in and out of the paper by about 10 nm to 100 μm, for example, although alternatively, the contact 127 may comprise other dimensions. The contact 127 may also comprise a plug contact, for example.

FIG. 8 shows a cross-sectional view of the completed semiconductor device 100 including a transistor 130 that includes the fins 104, semiconductive material 110, and CESL 114. The contact 127 provides electrical connection to the transistor 130. The contact 127 may be coupled to another device or component of the semiconductor device 100 and/or the contact 127 may be coupled to a subsequently formed contact pad on a top surface of the workpiece 102 by metallization layers of the semiconductor device 100, not shown.

Figure 9:
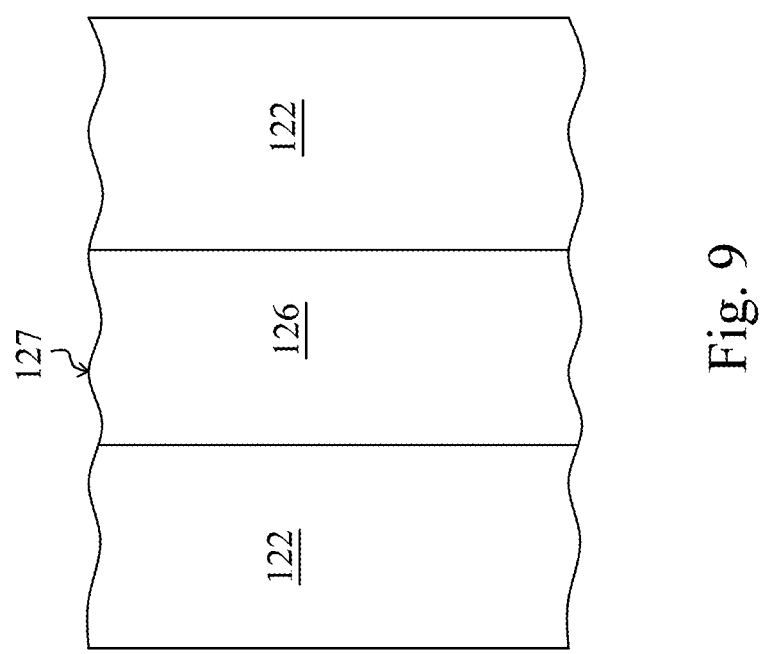
FIG. 9 is a top view of the semiconductor device shown in FIG. 8.

FIG. 9 is a top view of the semiconductor device shown in FIG. 8, illustrating that the contact 127 may comprise a slot contact that extends lengthwise over the tops of the fins 104.

Figure 10:
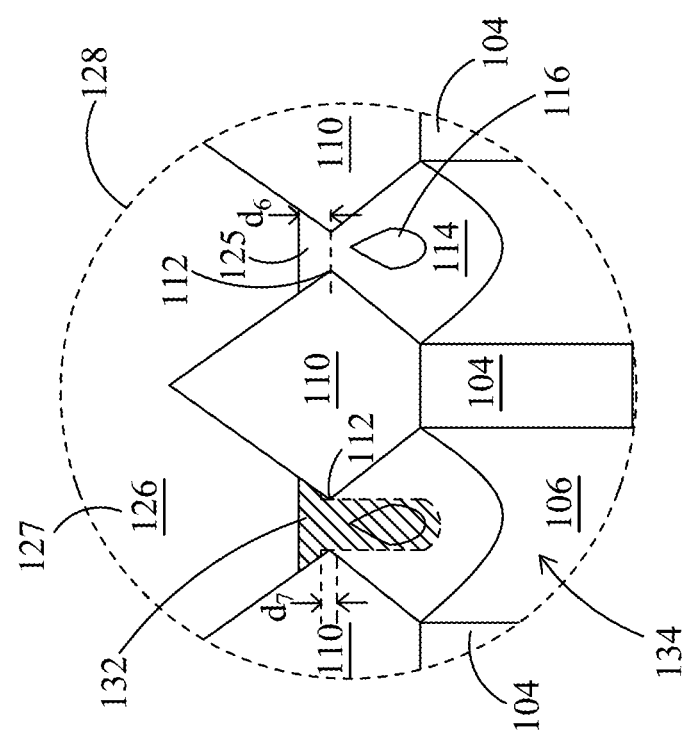
FIG. 10 is a more detailed view of a portion of the semiconductor device shown in FIG. 8.

FIG. 10 is a more detailed view of a portion of the semiconductor device 100 shown in FIG. 8. An expanded view proximate widest portions 112 of the semiconductive material 110 is shown. A potential problem that is alleviated by embodiments of the present disclosure is illustrated at 134 in phantom. If an insufficient amount of the etch stop layer 114, e.g., comprising dimension $d_7$, is left remaining above the widest portion 112 of the semiconductive material 110 after the etch process (leaving the structure shown in FIG. 7), then an opening is formed in the top surface of the etch stop layer 114 between the semiconductive material 110 over the fins 104. When the conductive material 126 is deposited or formed, a portion of the conductive material 126 would fill the opening and form conductive material between the semiconductive material 110 and possibly also the top portions of the fins 104, as shown in phantom in FIG. 10 at 132. Forming conductive material 126 between the fins 104 and semiconductive material 110 can cause reliability problems and can increase junction leakage.

Advantageously, in accordance with embodiments described herein, the formation of the semiconductive material 110, the formation of the etch stop layer 114, or both the formation of the semiconductive material 110 and the formation of the etch stop layer 114 are controlled such that a portion 125 of the etch stop layer 114 is disposed above the widest portion 112 of the semiconductive material 110 by dimension $d_6$, after the etch process to remove the insulating material 118/120/122 and the top portion of the etch stop layer 114, when forming the contact 127. The formation of the semiconductive material 110 may be controlled by controlling the space comprising dimension $d_4$ (see FIG. 4) between the semiconductive material 110; e.g., by controlling the space between the widest portions 112 of the semiconductive material 110 over the plurality of fins 104. The formation of the etch stop layer 114 may be controlled by controlling the thickness of the etch stop layer 114, for example. The formation of the semiconductive material 110 and the etch stop layer 114 may alternatively be controlled using other methods.

In some embodiments, the thickness of the contact etch stop layer 114 is selected so that the thickness of the contact etch stop layer 114 is equal to at least half a minimum space between the semiconductive material 110 over the plurality of fins 104, to ensure that an opening between the widest portions 112 of the semiconductive material 110 is not created. For example, if the space comprising dimension $d_4$ (see FIG. 4) between the widest portions 112 of the semiconductive material 110 is about 40 nm, the thickness of the contact etch stop layer 114 may be selected to be about 20 nm or greater, in accordance with embodiments. In other embodiments, the spacing or dimension $d_4$ between the widest portions 112 of the semiconductive material 110 can be selected based on the thickness of the etch stop layer 114.

Controlling the semiconductive material 110 and etch stop layer 114 formation may involve taking into consideration the dimensions $d_1$, $d_2$, and $d_3$ of the fins 104 and the amount of the recesses 108 in the insulating material 106, which may affect the amount of material of the semiconductive material 110 to grow and the amount of material of the etch stop layer 114 to deposit, for example.

The etch process for removing the insulating material 118/120/122 and the top portion of the etch stop layer 114 is also well-controlled to avoid removing too much of the contact etch stop layer 114 above the widest portions 112 of the epitaxially grown semiconductive material 110, in accordance with some embodiments.

Figure 11:
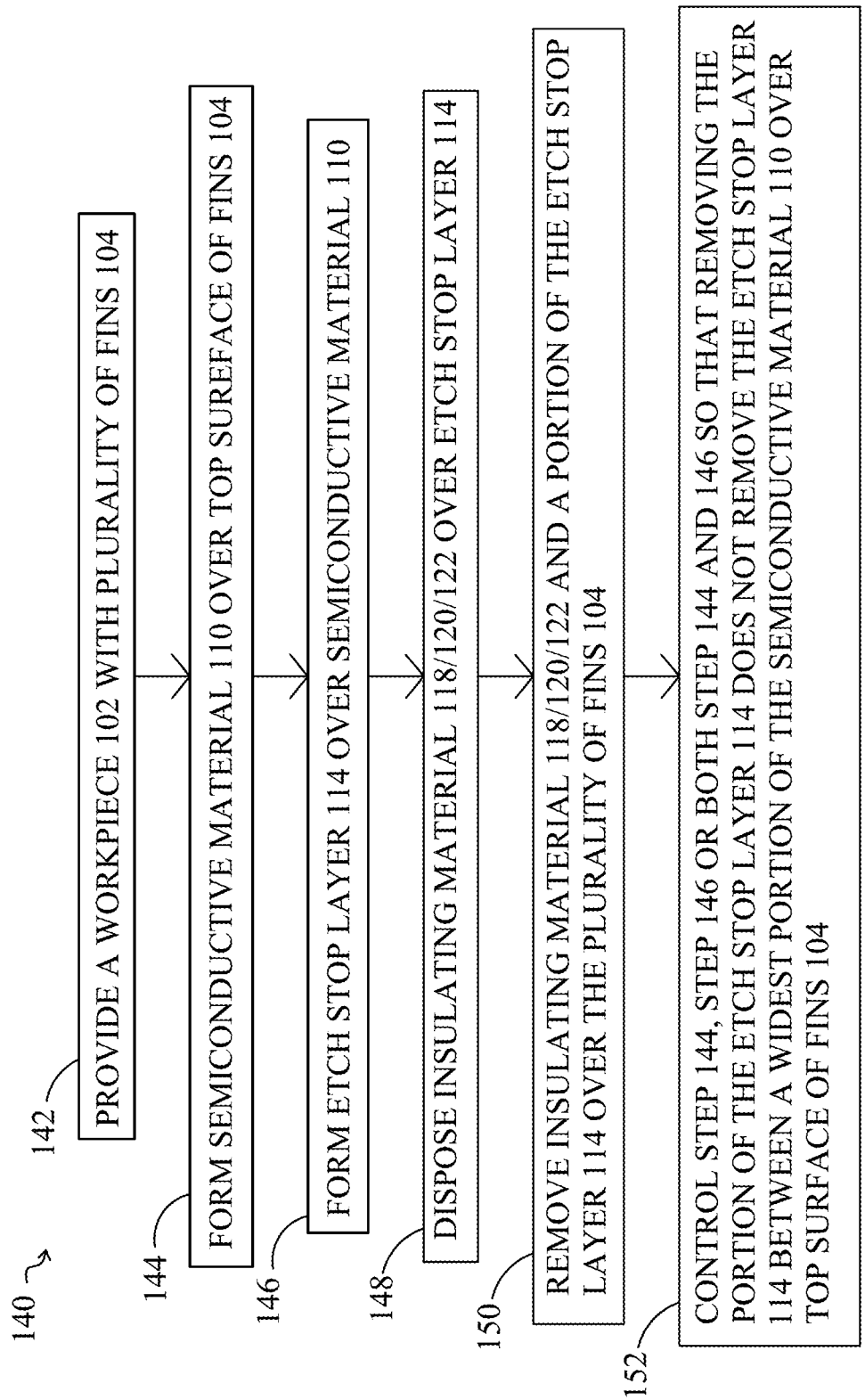
FIG. 11 is a flow chart for manufacturing the semiconductor device.

FIG. 11 is a flow chart 140 for manufacturing the semiconductor device 100. A workpiece 102 with a plurality of fins 104 is provided (step 142), and semiconductive material 110 is formed over the top surface of the fins 104 (step 144). The semiconductive material 110 is not formed on the sides of the fins 104 due to the presence of the insulating material 106 between the fins 104. Etch stop layer 114 is formed over the semiconductive material 110 (step 146). Insulating material 118/120/122 is disposed over the etch stop layer 114 (step 148), and the insulating material 118/120/122 and a portion of the etch stop layer 114 are removed over the plurality of fins 104 (step 150). Step 144, step 146, or both steps 144 and 146 are controlled so that removing the portion of the etch stop layer 114 does not remove the etch stop layer 114 between a widest portion of the semiconductive material 110 of the top surface of the fins 104 (step 152).

Advantages of embodiments of the disclosure include providing novel manufacturing methods wherein formation of conductive contact material 126 between fins 104 is prevented in a non-merged epitaxial profile for FinFET structures and applications. The novel methods provide solutions for contact landing and potential contact etching problems in non-merged epitaxial profiles. The thickness of the etch stop layer 114 and/or the space comprising dimension $d_4$ between widest portions 112 of epitaxially grown semiconductive material 110 are controlled, adjusted, and/or selected to prevent over-etching of the etch stop layer 114 between the semiconductive material 110 and/or the fins 104. The requirement for the use of a void filling material beneath the contact etch stop layer 114 is avoided by the well-controlled methods used to form the etch stop layer 114 and the semiconductive material 110, saving manufacturing time and costs. Reliability problems in contact 127 formation are reduced or eliminated. The novel manufacturing methods for semiconductor devices 100 and transistors 130 are easily implementable in manufacturing process flows.

In accordance with one embodiment of the present disclosure, a method of manufacturing a semiconductor device includes providing a workpiece comprising a plurality of fins, and forming a semiconductive material over a top surface of the plurality of fins. An etch stop layer is formed over the semiconductive material, and an insulating material is disposed over the etch stop layer. The insulating material and a portion of the etch stop layer are removed from over the plurality of fins. Forming the semiconductive material or forming the etch stop layer are controlled so that removing the portion of the etch stop layer does not remove the etch stop layer between a widest portion of the semiconductive material over the plurality of fins.

In accordance with another embodiment, a method of manufacturing a semiconductor device includes providing a workpiece, forming a plurality of fins over the workpiece, and epitaxially growing a semiconductive material over a top surface of each of the plurality of fins. An etch stop layer is formed over the semiconductive material, an insulating material is disposed over the etch stop layer, and the insulating material and a portion of the etch stop layer are removed over the plurality of fins. A conductive material is formed over the plurality of fins. Forming the semiconductive material or forming the etch stop layer are controlled so that removing the portion of the etch stop layer does not remove the etch stop layer between a widest portion of the semiconductive material over the plurality of fins.

In accordance with yet another embodiment, a method of manufacturing a transistor includes providing a workpiece, forming a plurality of fins over the workpiece, and epitaxially growing a non-merged semiconductive material over a top surface of each of the plurality of fins. The semiconductive material is wider proximate a central region than proximate a top surface of the semiconductive material. The method includes forming an etch stop layer over the semiconductive material, wherein a portion of the etch stop layer is formed below the wider central regions of the semiconductive material, disposing an insulating material over the etch stop layer, and etching away the insulating material and a top portion of the etch stop layer over the plurality of fins. A conductive material is formed over the plurality of fins to form a contact. Forming the semiconductive material or forming the etch stop layer are controlled so that removing the top portion of the etch stop layer does not remove the etch stop layer between the wider central regions of the semiconductive material over the plurality of fins.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece including a plurality of fins;
   forming a semiconductive material over a top surface of the plurality of fins;
   disposing a first insulating material over the semiconductive material;
   disposing a second insulating material over the first insulating material; and
   removing the second insulating material and a top portion of the first insulating material from over the plurality of fins, leaving a bottom portion of the first insulating material between a widest portion of the semiconductive material over the plurality of fins.

2. The method according to claim 1, wherein forming the semiconductive material is controlled so that removing the top portion of the first insulating material leaves the bottom portion of the first insulating material remaining between the widest portion of the semiconductive material over the plurality of fins.

3. The method according to claim 2, wherein forming the semiconductive material is controlled by controlling a space between the widest portions of the semiconductive material over the plurality of fins.

4. The method according to claim 1, wherein forming the first insulating material is controlled so that removing the top portion of the first insulating material leaves the bottom portion of the first insulating material remaining between the widest portion of the semiconductive material over the plurality of fins.

5. The method according to claim 4, wherein forming the first insulating material is controlled by controlling a thickness of the first insulating material.

6. The method according to claim 1, wherein forming the first insulating material comprises forming a material having an etch selectivity to the second insulating material.

7. The method according to claim 6, wherein forming the first insulating material comprises forming SiN, SiON, SiC, or SiOC, and wherein forming the second insulating material comprises forming an oxide or a nitride.

8. The method according to claim 1, wherein forming the first insulating material comprises forming a contact etch stop layer (CESL).

9. The method according to claim 1, wherein forming the second insulating material comprises forming a first inter-level dielectric (ILD) over the first insulating material, forming an etch stop layer (ESL) over the first ILD, and forming a second ILD over the ESL.

10. The method according to claim 1, wherein forming the semiconductive material and forming the first insulating material are controlled so that removing the top portion of the first insulating material leaves the bottom portion of the first insulating material remaining between the widest portion of the semiconductive material over the plurality of fins.

11. A method of manufacturing a semiconductor device, the method comprising:
    providing a workpiece;
    forming a plurality of fins over the workpiece;
    epitaxially growing a semiconductive material over a top surface of each of the plurality of fins;
    forming an etch stop layer over the semiconductive material;
    disposing an insulating material over the etch stop layer; and
    removing the insulating material and a top portion of the etch stop layer over the plurality of fins, wherein removing the top portion of the etch stop layer does not remove a bottom portion of the etch stop layer between a widest portion of the semiconductive material over the plurality of fins.

12. The method according to claim 11, wherein epitaxially growing the semiconductive material comprises forming a semiconductive material that is non-merged over the top surfaces of the plurality of fins.

13. The method according to claim 11, wherein removing the top portion of the etch stop layer comprises exposing a top portion of the semiconductive material over the top surface of each of the plurality of fins.

14. The method according to claim 11, further comprising forming a conductive material over the plurality of fins to form a contact.

15. A method of manufacturing a transistor, the method comprising:
    providing a workpiece;
    forming a plurality of fins over the workpiece;
    epitaxially growing a non-merged semiconductive material over a top surface of each of the plurality of fins, the semiconductive material being wider proximate a central region than proximate a top surface of the semiconductive material;

forming an etch stop layer over the semiconductive material, wherein a portion of the etch stop layer is formed below the wider central regions of the semiconductive material;

disposing an insulating material over the etch stop layer;

etching away the insulating material and a top portion of the etch stop layer over the plurality of fins, leaving a bottom portion of the etch stop layer between the wider central regions of the semiconductive material over the plurality of fins; and forming a conductive material over the plurality of fins to form a contact.

16. The method according to claim 15, wherein forming the etch stop layer comprises forming apertures in the etch stop layer between the semiconductive material over the plurality of fins, and wherein etching away the top portion of the etch stop layer does not reach the apertures in the etch stop layer.

17. The method according to claim 15, wherein forming the etch stop layer is controlled so that removing the top portion of the etch stop layer leaves the bottom portion of the etch stop layer remaining between the widest portion of the semiconductive material over the plurality of fins.

18. The method according to claim 17, wherein forming the etch stop layer is controlled so that a thickness of the etch stop layer is at least half of a minimum space between the semiconductive material over the plurality of fins.

19. The method according to claim 15, wherein forming the semiconductive material is controlled so that removing the top portion of the etch stop layer leaves the bottom portion of the etch stop layer remaining between the widest portion of the semiconductive material over the plurality of fins.

20. The method according to claim 15, wherein forming the plurality of fins comprises forming a channel, a drain region, or a source region of the transistor.

* * * * *